(12) United States Patent
Al-Tamimi et al.

(10) Patent No.: US 8,779,833 B2
(45) Date of Patent: Jul. 15, 2014

(54) CURRENT-MODE CMOS LOGARITHMIC FUNCTION CIRCUIT

(75) Inventors: Karama M. Al-Tamimi, Dhahran (SA); Munir Ahmed Al-Absi, Dhahran (SA)

(73) Assignee: King Fahd University of Petroleum and Minearals, Dhahran (SA)

( * ) Notice: Subject to any disclaimer, the term of this patent is extended or adjusted under 35 U.S.C. 154(b) by 228 days.

(21) Appl. No.: 13/418,228

(22) Filed: Mar. 12, 2012

(65) Prior Publication Data

US 2013/0234796 A1   Sep. 12, 2013

(51) Int. Cl.
*G06F 7/556* (2006.01)
(52) U.S. Cl.
USPC .......................................... 327/350; 327/427
(58) Field of Classification Search
USPC ................... 327/350, 427, 561–563
See application file for complete search history.

(56) References Cited

U.S. PATENT DOCUMENTS

| 7,564,289 B2* | 7/2009 | Imura ........................... 327/333 |
| 7,724,092 B2* | 5/2010 | Quan et al. .................... 330/288 |
| 7,737,759 B2 | 6/2010 | Gaeta et al. |
| 2006/0186944 A1 | 8/2006 | Chan et al. |

* cited by examiner

*Primary Examiner* — Hal L Nguyen
(74) *Attorney, Agent, or Firm* — Richard C. Litman

(57) ABSTRACT

The current-mode CMOS logarithmic function circuit provides an ultra-low power circuit that produces an output current proportional to the logarithm of the input current. An OTA (operational transconductance amplifier) constructed from CMOS transistors, in combination with two PMOS transistors configured in weak inversion mode for providing a reference voltage input and a voltage input from the input current to the OTA, provides the circuit with a high dynamic range, controllable amplitude, high accuracy, and insensitivity to temperature variation.

3 Claims, 4 Drawing Sheets

CURRENT-MODE CMOS LOGARITHMIC FUNCTION CIRCUIT

BACKGROUND OF THE INVENTION

1. Field of the Invention

The present invention relates to signal processing circuits, and particularly to a current-mode CMOS logarithmic function circuit that produces an output current proportional to the logarithm of the input current.

2. Description of the Related Art

Nowadays, a significant increase in the use of CMOS technology for realization of analog circuits has been observed. Current-mode circuits have received more attention than their voltage-mode counterparts. CMOS circuits with nonlinear functions will greatly enhance signal processing capabilities, such as clock recovery, waveform generation, adaptive filtering etc. Logarithmic function circuits produce an output that is proportional to the logarithm of the input. These types of circuits are used in applications that require compression of analog input data, linearization of transducers that have exponential outputs, and analog multiplication and division. Logarithmic functions are also widely used in many signal processing applications.

However, conventional logarithmic function circuits suffer from a number of limitations, including the absence of low voltage operation capacity, limited dynamic range, etc. Thus, a current-mode CMOS logarithmic function circuit solving the aforementioned problems is desired.

SUMMARY OF THE INVENTION

The current-mode CMOS logarithmic function circuit provides an ultra-low power circuit that produces an output current proportional to the logarithm of the input current. An operational transconductance amplifier (OTA) in combination with two P-channel metal oxide semiconductor (PMOS) transistors provides a high dynamic range, controllable amplitude, high accuracy, and insensitivity to temperature variation These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The current-mode CMOS logarithmic function circuit provides an ultra-low power circuit that produces an output current proportional to the logarithm of the input current. An OTA (operational transconductance amplifier) in combination with two PMOS transistors provides a high dynamic range, controllable amplitude, high accuracy and insensitivity to temperature variation.

Although theoretically or ideally there should be no current between the drain and source of a MOSFET when the transistor is turned off (the gate-to-source voltage is less than the threshold voltage of the device), in practice there is a weak inversion current that varies exponentially with the gate-to-source bias voltage. This is referred to herein as operation in the weak inversion mode. The current-mode CMOS logarithmic function circuit makes use of this phenomenon to produce an output current proportional to the logarithm (natural logarithm) of the input current.

Figure 1:
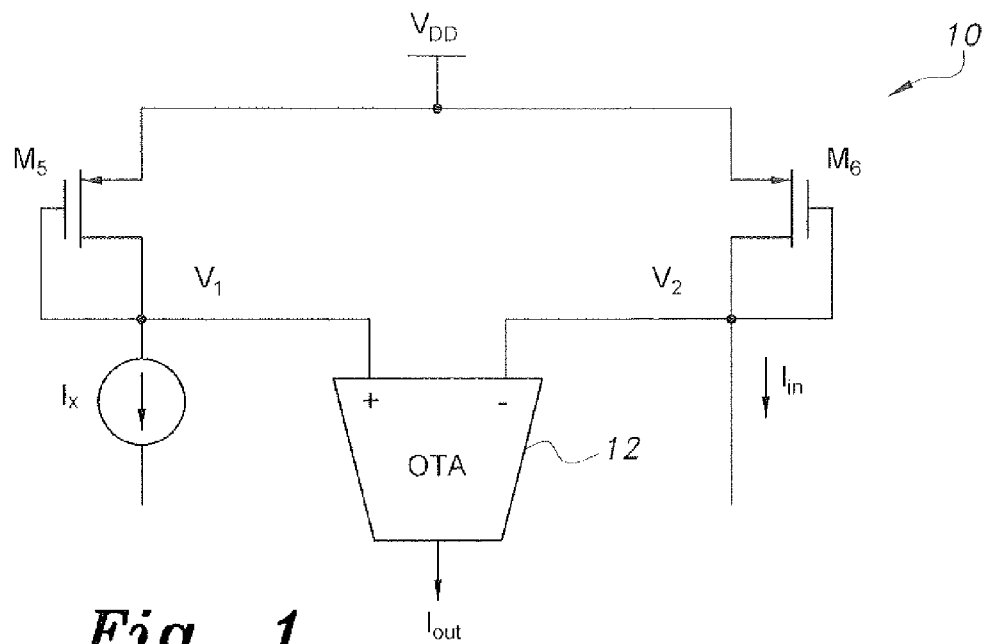
FIG. 1 is a partial schematic diagram of a current-mode CMOS logarithmic function circuit according to the present invention.

The PMOS transistors M5 and M6 are configured with OTA 12 as shown in FIG. 1. It is well known that the output current of the OTA is given by:

$$I_{out} = g_m(V_1 - V_2) \quad (1)$$

where $g_m$ is the transconductance of the MOS (metal oxide semiconductors) used in the OTA, and $V_1$ and $V_2$ are the two input voltages. Transistors M5 and M6 are biased in the weak inversion mode and used to convert current $I_x$ (a reference current) and $I_{in}$ (the input current) to voltages $V_1$ and $V_2$, respectively, as follows:

$$V_1 = V_{DD} - V_{SG5} = V_{DD} - nv_t \ln\left(\frac{I_x}{I_{Do}}\right) \quad (2)$$

$$V_2 = V_{DD} - V_{SG6} = V_{DD} - nv_t \ln\left(\frac{I_{in}}{I_{Do}}\right) \quad (3)$$

where $V_{DD}$ is the supply voltage and $V_{SG}$ is the gate-to-source voltage, $v_t$ is the thermal voltage, n is the slop factor and $I_{Do}$ is the leakage current of the MOSFET. As shown in FIG. 1, the voltage $V_1$ generated by the reference current is connected to the non-inverting input of the OTA 12, and the voltage $V_2$ generated by the input current is connected to the inverting input of the OTA 12. Combining equations (2) and (3) yields:

$$\ln\left(\frac{I_{in}}{I_x}\right) = \left(\frac{V_1 - V_2}{nv_t}\right) \quad (4)$$

Combining equations (4) and (1), the output current $I_{out}$ is given by:

$$I_{out} = g_m nv_t \ln\left(\frac{I_{in}}{I_x}\right) \quad (5)$$

The transconductance of the MOSFET transistor in weak inversion is given by:

$$g_m = \frac{I_D}{nv_t} \quad (6)$$

where $I_D$ is the bias current of the MOSFET and is given by Ibias/2. From (5) and (6), the output current can be rewritten as:

$$I_{out} = I_D \cdot \ln\left(\frac{I_{in}}{I_x}\right) \quad (7)$$

Figure 2:
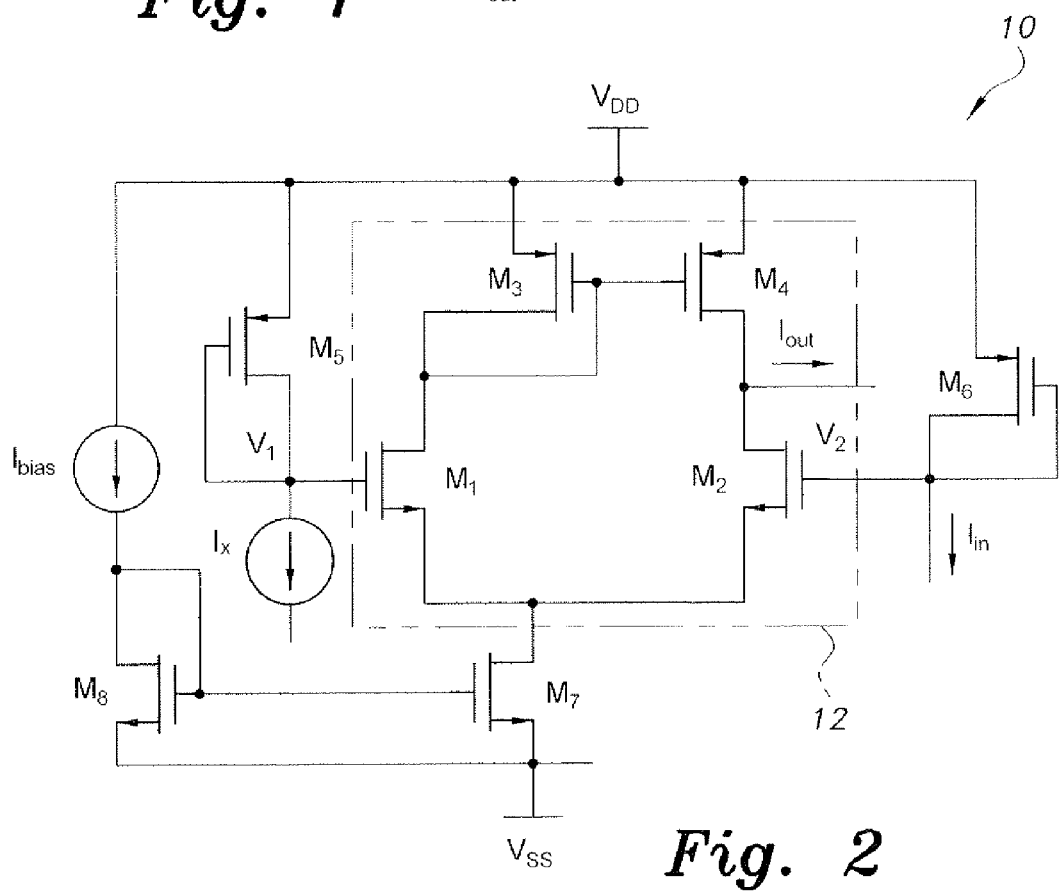
FIG. 2 is a detailed schematic diagram of a current-mode CMOS logarithmic function circuit according to the present invention.

With reference to equation (7) if the reference current $I_x$ is kept constant, the output current is proportional to the logarithm of the input current $I_{in}$. The amplitude of the output current can be controlled by the bias current $I_D$ of the OTA 12. The complete circuit diagram of the invention is shown in FIG. 2. Transistors M1-M4 form the OTA 12. Transistors M1-M4 are CMOS transistors. The OTA 12 avoids the use of bipolar semiconductors, and the use of only CMOS semiconductors reduces power consumption, enabling low voltage operation. Transistors M7 and M8 are CMOS transistors that provide the required bias current.

Figure 3:
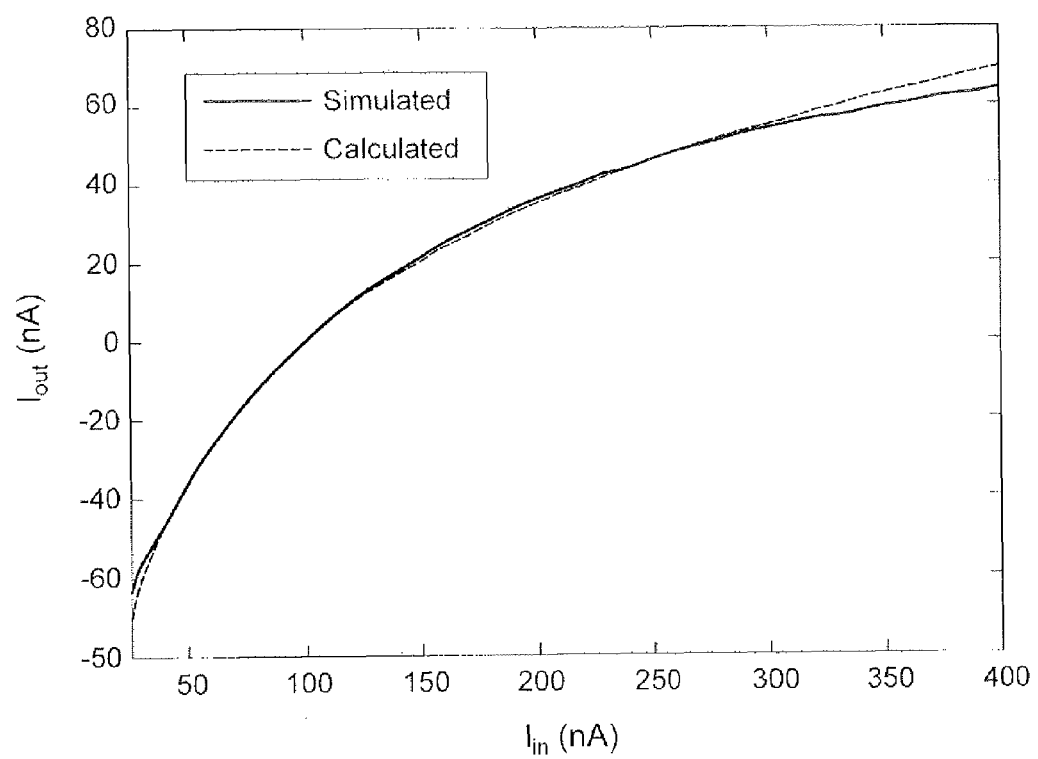
FIG. 3 is a plot of output current as a function of input current generated by an HSPICE simulation of the circuit of FIGS. 1 and 2.

The functionality of the circuit was carried out using HSPICE 0.35 um technology. The output current was measured by forcing it through a grounded load resistor $R_L=10$ kΩ. The results obtained with $I_{SS}=100$ nA (i.e., $I_D=50$ nA), $I_x=100$ nA and $V_{DD}=-V_{SS}=0.5$V are shown in plot 300 of FIG. 3. Plot 300 shows that the simulated results are in excellent agreement with the required function, thereby confirming the functionality of the circuit.

Figure 4:
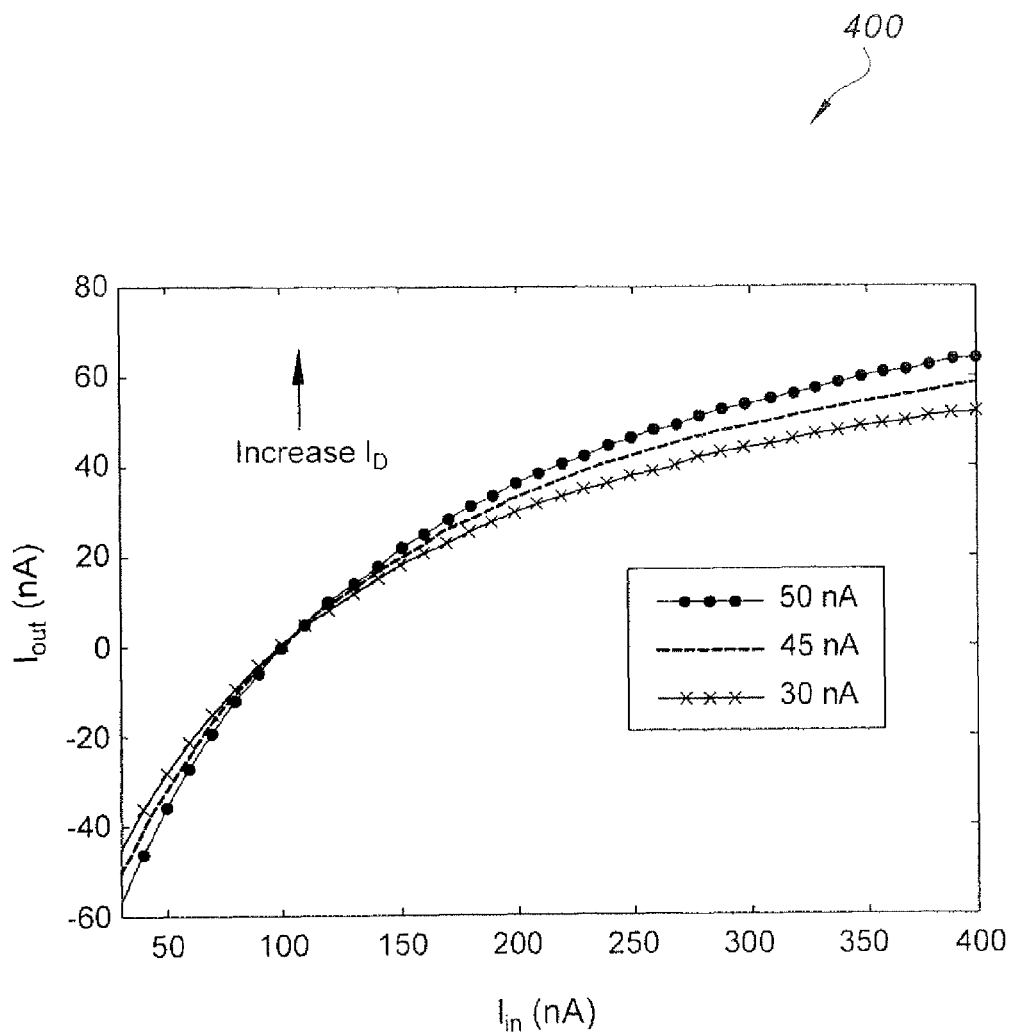
FIG. 4 is a plot of output current vs. input current generated by an HSPICE simulation of the circuit of FIGS. 1 and 2 for different bias currents.
Figure 5:
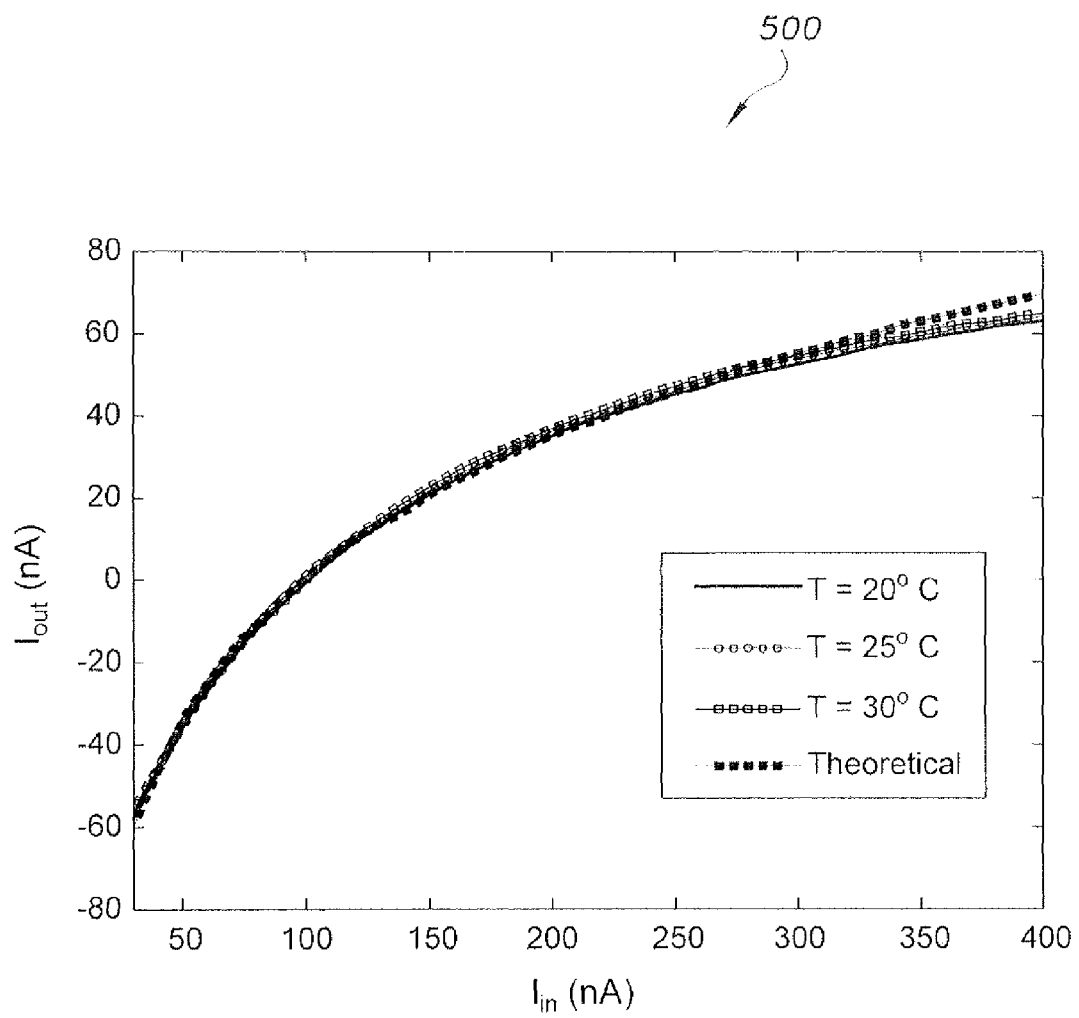
FIG. 5 is a plot of output current vs. input current generated by an HSPICE simulation of the circuit of FIGS. 1 and 2 for different operating temperatures.

Simulation was carried out for different bias currents ($I_D=40$, 45 and 50 nA) and different temperatures (T=20, 25 and 30° C.). Simulation results are shown in plot 400 of FIG. 4 and plot 500 of FIG. 5.

It is to be understood that the present invention is not limited to the embodiments described above, but encompasses any and all embodiments within the scope of the following claims.

We claim:

1. A current-mode CMOS logarithmic function circuit, comprising:

an operational transconductance amplifier (OTA) having an inverting voltage input, a non-inverting voltage input, and a current output $I_{out}$;
a pair of CMOS transistors configured in a bias circuit connected to said OTA for providing a bias current $I_D$ for controlling amplitude of the current at the current output $I_{out}$;
a first MOSFET adapted for receiving a reference current $I_x$, the first MOSFET being configured in weak inversion mode and producing a voltage output connected to the non-inverting input of the OTA; and
a second MOSFET adapted for receiving a current input $I_{in}$, the second MOSFET being configured in weak inversion mode and producing a voltage output connected to the inverting input of the OTA, wherein the OTA produces an amplified current at the current output $I_{out}$ as $$I_{out} = I_D \ln\left(\frac{I_{in}}{I_X}\right)$$

when the reference current $I_X$ has a constant value.

2. The current-mode CMOS logarithmic function circuit according to claim 1, wherein said first and second MOSFETs comprise a pair of P-channel metal oxide semiconductors (PMOS).

3. The current-mode CMOS logarithmic function circuit according to claim 1, wherein said OTA has semiconductors consisting of a plurality of complementary metal oxide semiconductor (CMOS) MOSFET transistors connected in a circuit for amplifying the current input to produce an amplified current at the current output proportional to the logarithm of the current input when the reference current has a constant value.

* * * * *